United States Patent

Nagaike et al.

[11] Patent Number: 5,945,213
[45] Date of Patent: Aug. 31, 1999

[54] EMI SHIELD AND A METHOD OF FORMING THE SAME

[75] Inventors: Ippei Nagaike, Ageo; Ryozo Mizuguchi, Yamato; Masatomo Yanase, Koshigaya, all of Japan

[73] Assignee: Yoshino Denka Kogyo, Inc., Saitama-Ken, Japan

[21] Appl. No.: 08/703,731

[22] Filed: Aug. 27, 1996

[30] Foreign Application Priority Data

Sep. 4, 1995 [JP] Japan ................................ 7-250148
Jul. 19, 1996 [JP] Japan ................................ 8-208860

[51] Int. Cl.⁶ .......................... B32B 5/16; B32B 27/00
[52] U.S. Cl. .................. 428/336; 428/423.1; 428/425.8; 428/461; 428/469
[58] Field of Search ............... 428/423.1, 425.8, 428/461, 469, 328, 336

[56] References Cited

U.S. PATENT DOCUMENTS

| | | | |
|---|---|---|---|
| 3,657,003 | 4/1972 | Kenney | 117/120 |
| 4,517,118 | 5/1985 | Stoetzer | 252/513 |
| 4,663,240 | 5/1987 | Hajdu et al. | 428/545 |
| 5,076,841 | 12/1991 | Chen et al. | 106/1.25 |
| 5,399,432 | 3/1995 | Schleifstein et al. | 428/403 |
| 5,603,983 | 2/1997 | Clough et al. | 427/126.3 |

FOREIGN PATENT DOCUMENTS 62-500344   2/1987   Japan .

*Primary Examiner*—Paul Thibodeau
*Assistant Examiner*—Holly Rickman
*Attorney, Agent, or Firm*—Fay, Sharpe, Beall, Fagan, Minnich & McKee

[57] ABSTRACT

Improved shield against electromagnetic interference comprises an undercoat formed on at least one surface of a nonconductive substrate comprising a jacket or case of electronic equipment or part thereof that are vulnerable to electromagnetic interference and a metal layer formed over said undercoat; said undercoat is composed of 10–60 wt % of a composite metal oxide hydrate and 40–90 wt % of a binder and said metal layer is formed by electroless plating of copper and/or nickel.

8 Claims, 1 Drawing Sheet

EMI SHIELD AND A METHOD OF FORMING THE SAME

BACKGROUND OF THE INVENTION

This invention relates to a shield of electromagnetic interference (EMI). More particularly, the invention relates to an EMI shield comprising a nonconductive substrate overlaid with an undercoat which, in turn, is overlaid with a metal layer. The invention also relates to paint compositions for applying said undercoat.

With the recent development of an advanced information-intensive society, the use of electric waves over various frequency bands is rapidly increasing in such areas as multi-channel access systems and mobile communication equipment typified by cellular phones. This trend will be accelerated if the PHS (personal handy-phone system) and radio-LAN which has recently been put to field use becomes commonplace. Personal computers and other electronic equipment for consumer use that incorporate microcomputers have already become popular tools. As one can easily imagine, the electric waves radiated from these apparatus will add to the already versatile and complicated environment associated with electric waves; in addition, the use of higher-frequency bands will increase in the years to come.

In this situation, the electromagnetic interference and/or radio frequency interference resulting from various electronic equipment has been a cause of various troubles such as erroneous operations of other electronic equipment, electronic parts, computers and machining tools, leakage of information, and noise to television sets and radio receivers. The occurrence of such troubles has been increasing every year and a further increase is predicted for the future.

If electronic equipment and parts thereof are jacketed or encased with plastics, they are practically transparent to disturbing electromagnetic waves and/or radio frequency interference unless appropriate protections against EMI are applied.

Means commonly employed for this purpose are shields of electromagnetic interference and electric wave absorbing materials. The former is such that electromagnetic waves coming from outside are reflected and thereby prevented from propagation into the electronic apparatus or part thereof to be protected or, alternatively, electromagnetic waves coming from inside are reflected such that they will not radiate out of the electronic apparatus or part thereof. Electric wave absorbing materials are such that the incident electric waves are converted to thermal energy so that the intensity of their transmission or reflection is reduced markedly.

Ferrites and carbon are extensively used as electric wave absorbing materials. Sintered ferrites are effective at comparatively low frequencies such as those in the VHF band whereas carbon is effective at comparatively high frequencies. Both ferrites and carbon can be used as mixtures, or dispersions in organic substances such as rubbers or plastics; in this case, the absorption characteristics can be controlled by adjusting the content of the electric wave absorber or by using more than one electric wave absorber. Carbon-based electric wave absorbers are frequently used as such mixtures and those which incorporate carbon black and/or graphite particles have been commercialized.

However, the prior art carbon-based electric wave absorbers incorporating carbon black and/or graphite particles are not considered to exhibit satisfactory absorbing characteristics and a further improvement in performance has been desired. As already mentioned, ferrites are effective in absorbing electromagnetic waves at frequencies of about several hundred MHz but are not capable of satisfactory absorption of electromagnetic waves at higher frequencies in the GHz band which is anticipated to find increased use in the future. In contrast, carbon black is capable of absorbing electromagnetic waves at frequencies in the GHz band but its absorption zone is not very wide.

Other materials that are effective as absorbers of electric waves include aluminum, lead, zinc, titanium, lithium, stainless steel, silver, copper and fibers. In particular, PZT (lead zirconate titanate) and PLZT (lead lanthanum zirconate titanate) are effective in absorbing electric waves at frequencies in the GHz band; however, the amount by which these materials can be dispersed or incorporated in plastics is limited by various factors including the melt viscosity of the plastics used, their processability, the mechanical strength, brittleness and adhesion of fibers, films, sheets and other shaped parts of the plastics in which those metals are dispersed or incorporated. It is also known that if the incorporation of conductive metals is unduly small, satisfactory absorption characteristics are not attained.

Under the circumstances, electronic equipment and parts thereof jacketed or encased with plastics are commonly protected against disturbing electromagnetic waves and/or radio frequency interference by means of EMI shields rather than electric wave absorbers. Methods currently employed to form EMI shields over suitable surfaces of plastic jackets or cases include the application of conductive paints, metal-arc spraying, vacuum metallizing, evaporating, cladding, and deposition of metal layers (by electroplating or electroless plating).

In practice, however, it is not always easy to form EMI shields over surfaces of plastic jackets or cases and the plastic surfaces have to be given a preliminary treatment in order to ensure positive depositing of the intended EMI shields. However, mechanical pretreatments such as surface roughening may occasionally destroy the plastic surfaces per se.

To avoid this problem, primer paints are applied to form undercoats which, in turn, are overlaid with EMI shields. However, the heretofore used primer paints mostly contain metal particles as a film-forming component and, as is well known, such metal particles will react with the water in the atmosphere to form metal oxides which, in turn, cause the applied primer coat to swell, eventually leading to delamination. Alternatively, the organic solvents used in the primer paints will cause delamination of the applied primer coat (see, for example, Japanese Domestic Announcement (kohyo) No. 50034/1987). Another potential cause of delamination is the crazing which may occur during shaping. For whichever reason, the EMI shields formed over the undercoat will be destroyed to lose the ability to protect electronic equipment or parts thereof against disturbing electromagnetic waves and/or radio frequency interference.

SUMMARY OF THE INVENTION

An object, therefore, of the present invention is to provide an EMI shield that comprises an undercoat and a metal layer and which is to be formed over a suitable surface of a plastic jacket or case on electronic equipment, parts thereof, etc.

Another object of the invention is to provide a paint composition suitable for forming the undercoat of the EMI shield.

Yet another object of the invention is to provide a novel metal component suitable for use in the paint composition.

The first object of the invention can be attained by an EMI shield which comprises an undercoat formed on at least one surface of a nonconductive substrate comprising a jacket or case of electronic equipment or part thereof that are vulnerable to electromagnetic interference and a metal layer formed over said undercoat, wherein said undercoat is composed of 10–60 wt % of a composite metal oxide hydrate and 40–90 wt % of a binder and wherein said metal layer is formed by electroless plating of copper and/or nickel.

In a preferred embodiment, the undercoat is formed either from a paint composition A comprising 10–60 wt % of a composite metal oxide hydrate, 25–89 wt % of an acrylic resin paint and/or an urethane resin paint and 1–15 wt % of resin beads or from a paint composition B comprising 10–60 wt % of a composite metal oxide hydrate and 40–90 wt % of a mixture of a polyol paint and a polyisocyanate curing agent. In paint composition B, the weight ratio of the polyol paint to the polyisocyanate curing agent ranges from 10:1 to 10:10.

DETAILED DESCRIPTION OF THE INVENTION

Figure 1:
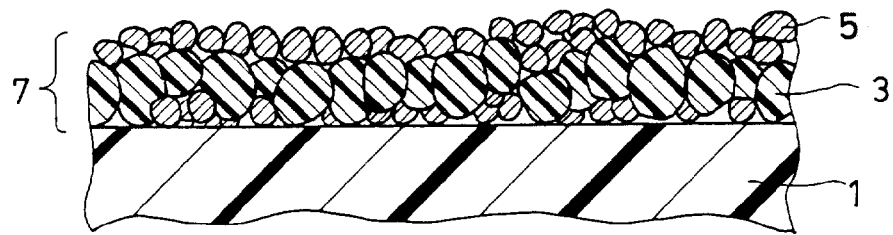
FIG. 1 is a schematic cross section of an undercoat formed over a nonconductive substrate using paint composition A.

The EMI shield of the invention is suitable for use with a wide variety of electronic equipment that are sensitive to electromagnetic disturbances including personal computers, radio transmitters, cellular phones, radio receivers, television sets, microwave ovens, cameras, video cameras, machining tools, measuring instruments and robots. The shield is effective not only in retarding the entrance of electromagnetic disturbances into the equipment but also in preventing outward radiation of electromagnetic waves. Examples of the electronic equipment that will radiate electromagnetic waves outwardly are motors and inverters. The EMI shield of the invention is formed on at least one surface of the jacket or case of the above-mentioned electronic equipment and parts thereof.

The term "EMI shield" as used herein should be understood in the broadest scope of its meaning and includes not only shields of electric waves at frequencies below 3,000 GHz but also shields of electromagnetic waves in other frequency bands and all electric waves at radio frequencies.

The jacket of electronic equipment is usually molded of substrate nonconductors such as plastics, which may be thermoplastic or thermosetting resins. Exemplary thermoplastic resins include: general-purpose plastics such as PE (polyethylene), PVC (polyvinyl chloride), PS (polystyrene), PP (polypropylene), ABS (acrylonitrile-butadiene-styrene), AS (acrylonitrile-styrene), PMMA (polymethyl methacrylate), PVA (polyvinyl acetate), PVDC (polyvinylidene chloride), PPO (polyphenylene oxide), and PET (polyethylene terephthalate); general-purpose engineering plastics such as PA (polyamide), POM (polyacetal), PC (polycarbonate); PPE (modified polyphenylene ether), PBT (polybutylene terephthalate), GE-PET (glass fiber reinforced polyethylene terephthalate) and UHPE (ultrahigh-molecular weight polyethylene); and super-engineering plastics such as PSF (polysulfone), PES (polyethersulfone), PPS (polyphenylene sulfide), PAR (polyarylate), PAI (polyamideimide), PEI (polyetherimide), PEEK (polyetheretherketone), PI (polyimide) and fluorocarbon resins. Exemplary thermosetting resins include phenolic resins, urea resins, melamine resins, alkyd resins, unsaturated polyesters, epoxy resins, diallyl phthalate polymers, polyurethanes and silicone resins. In short, all synthetic resins that can be molded to form the jackets of electronic equipment are useful in the invention.

Other materials that can be used as the nonconductive substrate of the EMI shield of the invention are those which are transparent to electromagnetic waves and which can be molded to form the jackets of electronic equipment, as exemplified by rubbers, ceramics, glass, glass fibers, wood, fiber-reinforced plastics, porcelain, fibers and paper.

When paint composition A or B is to be applied to surfaces of substrate nonconductors such as plastics, preliminary surface treatments of the latter are generally unnecessary. But, if desired, surfaces of the nonconductive substrate may be subjected to pretreatments including chemical cleaning, blasting, corona discharge, plasma discharge, uv irradiation and flame spraying.

Paint composition A or B may be applied to surfaces of the nonconductive substrate by any conventional methods including brushing, spraying, dipping, roll coating and electrostatic coating (or deposition).

Paint composition A or B as applied to surfaces of the nonconductive substrate is subsequently dried to form an undercoat, which is preferably composed of 10–60 wt % of a composite metal oxide hydrate and 40–90 wt % of a binder. If the content of the composite metal oxide hydrate in the undercoat is less than 10 wt %, a defect such as failure in plate deposition will occur. If the content of the composite metal oxide hydrate in the undercoat exceeds 60 wt %, a defect such as poor adhesion or cohesive failure will occur.

The thickness of the undercoat is not limited to any particular value. The as-dried undercoat has typically a thickness in the range of 3–25 $\mu$m, preferably ranging from 5 to 15 $\mu$m in the case where the undercoat is formed of paint composition A and ranging from 10 to 20 $\mu$m when the undercoat is formed of paint composition B.

The acrylic resin paint and the urethane resin paint which are used in paint composition A are known in the art and commercially available from, for example, ZENECA under trade names such as NEOCRYL and NEOREZ. The acrylic and urethane resin paints may optionally incorporate thickeners, wetting agents, film thickness increasing agents, fillers and other suitable auxiliary additives. A suitable thickener is one of SN Thickener Series from Sannopco Co., Ltd.; a suitable wetting agent is FLUORAD FC-430 of Minnesota Mining and Manufacturing Company (3M); suitable film thickness increasing agents are alcoholic organic solvents such as isopropyl alcohol, isobutyl alcohol, butyl cellosolve, diacetone alcohol and propylene glycol; suitable fillers include calcium carbonate, silica, zeolite, barium sulfate and carbon black in a powder form which have particle sizes in the range from 0.01 $\mu$m to 5 $\mu$m.

The resin beads used in paint composition A are also known and may suitably be selected from among the beads of acrylic resins, polyesters, polyurethanes, nylons, polypropylenes, etc. To take acrylic resin beads as an example, they are commercially available from DAINICHISEIKA COLOUR & CHEMICALS MFG. CO., LTD. under the trade names RUBCOLOUR. Resin beads particularly suitable for use in paint composition A have an average particle size of about 5–30 μm but resin beads having smaller or greater average particle sizes may of course be used.

The polyol paint to be used in paint composition B is known in the art and commercially available from, for example, BAYER, under trade names such as DESMODUR and BIHYDROL. If desired, the polyol paint may incorporate thickeners, wetting agents, film thickness increasing agents, fillers and other suitable auxiliary additives as described above in connection with paint composition A.

Paint composition B contains a curing agent for curing the polyol paint. The proportion of the curing agent is widely variable from one tenth of a part to one part per part of the polyol paint. Preferably, one part of the curing agent is contained in four parts of the polyol paint. If the amount of the curing agent is unduly small compared to the polyol paint, difficulty is involved in carrying out the intended curing reaction. If the amount of the curing agent is excessive, the curing reaction is saturated and only diseconomy will result without any added advantage. A preferred curing agent is a polyisocyanate. The polyisocyanate-mediated curing reaction is accelerated by heating and the preferred heating temperature ranges from 40° C. to 180° C.

The composite metal oxide hydrate which is to be used in both paint compositions A and B is formed of two metals, one selected from among Pd and Ag and the other selected from among Si, Ti and Zr. The exact structural formula of the composite metal oxide hydrate is yet to be verified and is only a matter of guess; however, it will most probably be expressed by the following general formula:

$$M_{1x} \cdot M_2 O_3 \cdot n(H_2O)$$

where $M_1$ is Pd or Ag, $M_2$ is Si, Ti or Zr; if $M_1$ is Pd, x is 1 and if $M_1$ is Ag, x is 2; n is an integer.

While $M_1$ may be Pd or Ag, it is preferably palladium because halides, particular chlorides, of palladium have such high activity that they have greater tendency to enter into reaction.

Referring to Si, Ti or Zr as $M_2$, these metals may be in the form of any compounds including oxides, hydrates and halides; however, these metals are preferably contained as oxides, e.g., $SiO_2$, $TiO_2$ and $ZrO_2$. The particle size of Si, Ti or Zr compounds that are used to form the composite metal oxide hydrate is not limited to any particular value but it is generally preferred that their average particle size is in the range from 0.001 to 5 μm. With smaller particles, the reactivity is increased, contributing to an improved yield.

The composite metal oxide hydrate for use in paint composition A or B may be prepared by the following procedure. First, a Pd or Ag compound (e.g. palladium chloride) is dissolved in hydrochloric acid; then, a hydrate of Si, Ti or Zr oxide (e.g. titanium oxide) is added to the solution and heated; the solution is thereafter neutralized, further heated, with the resulting precipitate being washed. This sequence of reactions may be represented by the following formulae:

$$PdCl_2 + 4HCl \rightarrow H_2[PdCl_6] + H_2 \quad (1)$$

$$TiO_2 \cdot (H_2O) + 2HCl \rightarrow TiOCl_2 + 2H_2O \quad (2)$$

$$H_2[PdCl_6] + TiOCl_2 \rightarrow TiO[PdCl_6] + 2HCl \quad (3)$$

$$2TiO[PdCl_6] + 12NaOH \rightarrow 2PdTiO_3 \cdot 6H_2O + 12NaCl + O_2 \quad (4)$$

When applying paint composition A to a substrate nonconductor such as a plastic material, thereby forming an undercoat, said paint composition is preferably coated in the usual manner to give a thickness of 3–20 μm, then dried by heating at a temperature of 40–180° C. for 20–60 min to give a film thickness of 5–15 μm on a dry basis. In the case of paint composition B, it is preferably coated to give a thickness of 10–40 μm, then dried by heating at a temperature of 40–180° C. for 20–60 min to give a film thickness of 10–20 μm on a dry basis. The heating temperature may be determined as appropriate in consideration of factors such as the heat resisting temperature of the nonconductive substrate used.

FIG. 1 is a schematic cross section of an undercoat formed by applying paint composition A to a nonconductive substrate. As shown, resin beads 3 are present in contact with one surface of the substrate 1. The outer surfaces of the resin beads 3 are entirely covered with the particles of a composite metal oxide hydrate 5. Thus, the outermost surface of the undercoat 7 is covered with the particles of the composite metal oxide hydrate. The resin beads 3 are used not only to provide the undercoat 7 with a predetermined thickness but also to furnish an increased surface area for coverage with the particles 5 of the composite metal oxide hydrate. The acrylic or urethane resin paint will serve to enhance the dispersibility of those particles and thereby form a uniform coating. As shown, the outermost surface of the undercoat 7 is covered with the composite metal oxide hydrate and this facilitates subsequent plating operations.

Figure 2:
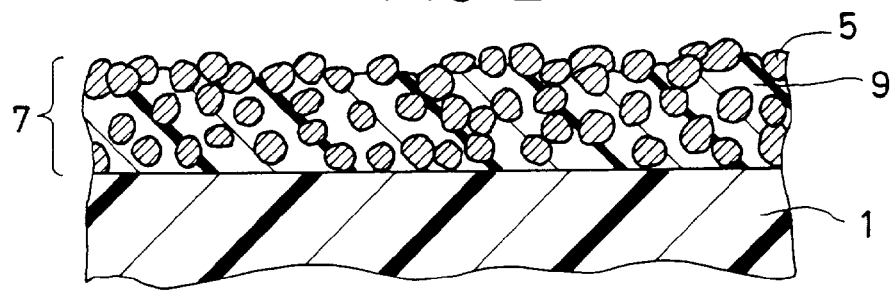
FIG. 2 is a schematic cross section of an undercoat formed over a nonconductive substrate using paint composition B.

FIG. 2 is a schematic cross section of an undercoat formed by applying paint composition B to a nonconductive substrate. As shown, the undercoat 7 has the particles 5 of the composite metal oxide hydrate dispersed uniformly within a polyurethane resin layer 9 that has been cured with a polyisocyanate.

A surface of the undercoat shown in FIGS. 1 and 2 is then overlaid with a metal layer, which can be formed by a conventional electroless plating technique. If desired, the metal layer formed by electroless plating may be plated with an electrolytically deposited layer. Prior to plating, the undercoat is preferably treated with an accelerator acid such as sulfuric acid, hydrofluoric acid or hydrochloric acid. This treatment will activate the composite metal oxide hydrate in the undercoat and thereby assure better adhesion to the metal layer to be formed by electroless plating. After the optional treatment with an accelerator acid, the surface of the undercoat has metal components such as copper and nickel deposited by electroless plating. Nickel is deposited after copper in order to ensure that verdigris will not form on the copper plate surface. The technique of electroless plating of metals is well known to the skilled artisan. The plate is preferably subjected to a neutralization treatment in order to neutralize the sodium hydroxide that may have migrated from the plating bath into the undercoat and the copper deposit formed by electroless plating. As a result of this neutralization treatment, the adhesion between the undercoat and the metal layer formed by electroless plating is sufficiently improved to ensure that the EMI shield will not easily delaminate during use. The thickness of the metal layer to be formed by electroless plating depends on the frequency of the electromagnetic waves from which the electronic apparatus of interest should be shielded and it is preferably within the range of 0.5–4 μm. If the thickness of the metal layer is less than 0.5 μm, no satisfactory shield effect is attained. If the thickness of the metal layer exceeds 4 μm, the shield effect is saturated and diseconomy will simply result.

Figure 3:
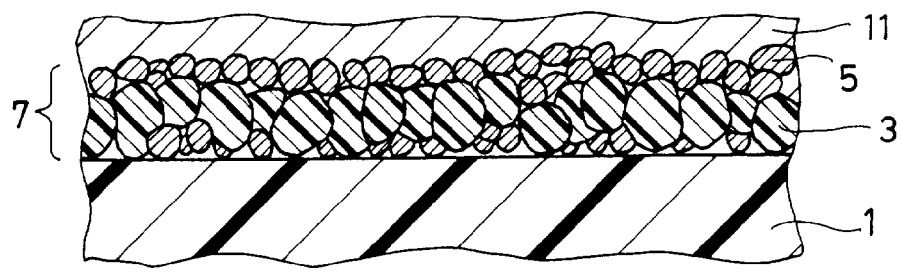
FIG. 3 is a schematic cross section of the system of FIG. 1 except that the undercoat is overlaid with a metal layer.
Figure 4:
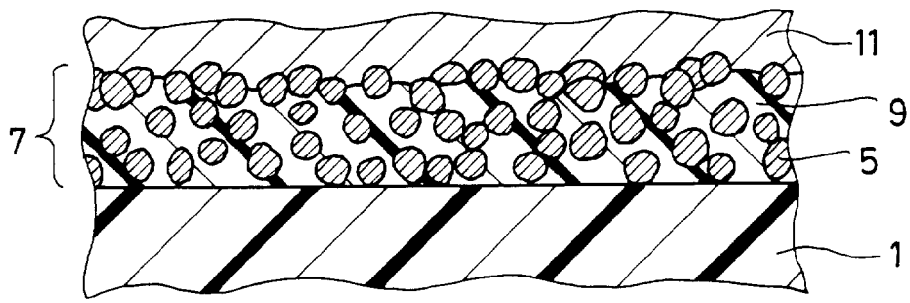
FIG. 4 is a schematic cross section of the system of FIG. 2 except that the undercoat is overlaid with a metal layer.

FIG. 3 is a schematic cross section of the system of FIG. 1 except that a metal layer is formed on a surface of the undercoat by electroless plating. FIG. 4 is a schematic cross section of the system of FIG. 2 except that a metal layer is formed on a surface of the undercoat by electroless plating. The metal layer is indicated by 11 and proves to be an effective shield against electromagnetic interference.

The metal layer formed by electroless plating may be overlaid with one or more metal (e.g. Ni, Zn, Cu or Sb) layers by electroplating. As already mentioned, the metal layer formed by electroless plating has a good shield effect on its own but its effectiveness can be enhanced by the electrolytic deposition of metals. The electrolytically deposited plate has the added advantage of enhancing the aesthetic appeal of the metal layer formed by electroless plating. The thickness of the electrolytically deposited metal is not limited to any particular value and thicknesses of 3–60 μm will generally suffice.

The following examples are provided for the purpose of further illustrating the process for producing the EMI shield of the present invention, as well as its effectiveness in the shielding of electromagnetic interference.

EXAMPLE 1

Preparation of Composite Metal Oxide Hydrate

The preparation of a composite metal oxide hydrate for use in the invention is first described. It should, however, be noted that the following description is intended for illustrative purposes only and other methods can be used to prepare the composite metal oxide hydrate.

(1) Dissolve palladium chloride ($PdCl_2$) in 12 N hydrochloric acid (HCl).
(2) The fine particles of titanium oxide ($TiO_2$) are subjected to a preliminary treatment for increasing their energy level, such as uv irradiation, heating with microwaves or exposure to visible light. Add the thus treated fine particulate compound to the solution prepared in step (1). Also add glass beads (2–3 mmφ) and heat the mixture with agitation at 60–100° C. for 10–60 min in order to ensure that $TiO_2$ is thoroughly dispersed. Stop heating and agitation when a uniform slurry is obtained.
(3) Neutralize with sodium hydroxide (NaOH) or sodium carbonate ($Na_2CO_3$) until a pH of 7–10 is attained.
(4) Heat the neutralized mixture at 60–100° C. for 1–4 h, preferably at 70–80° C. for 2–3 h, in order to carry out a solidifying reaction.
(5) Separate the solid precipitate forming as the result of the solidifying reaction. First wash the reaction product and remove the supernatant by decantation. Repeat this step two to three times. All portions of the supernatant should be removed by decantation. Thereafter, pure water is added and further washing is performed. Remove the supernatant by decantation. Washing with pure water is performed in order to remove miscellaneous ions in the solid precipitate.
(6) After the washing with pure water, a slurried mixture of pure water and the solid precipitate is left to stand. The slurried mixture has a solids content of about 50–60%. Upon standing, the slurried mixture separates into the precipitating solids and an overlying liquid phase. The overlying liquid layer enables the solid composite metal oxide hydrate [$PdTiO_3 \cdot n(H_2O)$] to be stored in a nonoxidized state, which is very advantageous for subsequent use of the product. When stored in a slurried form, the composite metal oxide hydrate remains highly dispersible to ensure a marked improvement in the efficiency of the mixing operation to be performed during subsequent use. If the composite metal oxide hydrate contacts atmospheric air, it will be oxidized and be deteriorated in performance. Even if it is stored in a powder form as isolated from air, an unduly prolonged time (say, ten odd hours) will be taken to perform the intended mixing with agitation during subsequent use. Therefore, the composite metal oxide hydrate to be used in the invention is preferably stored as a slurry. In the experiment we conducted, the composite metal oxide hydrate in the slurry had an average particle size of 1–100 μm.

EXAMPLE 2

Preparation of Paint Composition A

A binder having the following composition was prepared.

| | |
|---|---|
| Neocryl A-640 (Zeneca) | 350 parts |
| Neorez R-960 (Zeneca) | 250 parts |
| Butyl cellosolve | 120 parts |
| Fluorad FC-430 (3M) | 1 part |
| SN Thickener 612 (Sannopco) | 30 parts |
| Rubcolour Clear (Dainichiseika Colour & Chemicals Mfg.) | 50 parts |
| Ion-exchanged water | 199 parts |
| | 1,000 parts |

To 7 parts of this binder, there was added 3 parts of the slurried composite metal oxide hydrate which was prepared in Example 1 and the ingredients were mixed at room temperature until the composite metal oxide hydrate was dispersed uniformly. In this way, paint composition A was prepared.

EXAMPLE 3

Preparation of Paint Composition B

A binder base having the following composition was prepared.

| | |
|---|---|
| Bayhydrol TPLS2940E (Bayer) | 800 parts |
| Fluorad FC430 (3M) | 1 part |
| Emulsifier WN (Bayer) | 5 parts |
| Butyl cellosolve | 20 parts |
| Primal RM8 (R&H) | 5 parts |
| BYK023 (BYK) | 3 parts |
| Ion-exchanged water | 166 parts |
| | 1,000 parts |

To this binder base, 100 parts of SUMIDUR N-75 (Sumitomo-Bayer) was added as a curing agent; the ratio of the binder base to the curing agent was 10:1. To 7 parts of the resulting binder, there was added 3 parts of the slurried composite metal oxide hydrate which was prepared in Example 1 and the ingredients were mixed at room temperature until the composite metal oxide hydrate was dispersed uniformly. In this way, paint composition B was prepared.

EXAMPLE 4

Formation of Undercoat (1)

A substrate ABS resin having a thickness of 3 mm was coated on one side with paint composition A by means of a spray gun to give a coating thickness of 20 μm. Upon drying at 70° C. for 30 min, an undercoat was formed in a thickness of 10 μm.

EXAMPLE 5

Formation of Undercoat (2)

A substrate ABS resin having a thickness of 3 mm was coated on one side with paint composition B by means of a spray gun to give a coating thickness of 20 μm. Upon drying at 70° C. for 30 min, an undercoat was formed in a thickness of 10 μm.

EXAMPLE 6

Formation of Metal Layer (1)

The undercoat formed in Example 4 was overlaid with metal layers by electroplating. First, the surface of the undercoat was washed with warm water (45–55° C.) for 2 min. Thereafter, the undercoat had its surface treated with an accelerator (1–5 vol % $H_2SO_4$) at 45–55° C. over a period of 5 min. This treatment was for activating the palladium hydroxide in the undercoat. Following two washings with water, the undercoat was treated with an activator consisting of palladium (60–90 ppm) and HCl (10–20 mL/L) at 25–35° C. for 1 min. Following two washings with water, a copper plate was deposited by 5-min electroless plating in a strike bath containing 1.5–2.5 g/L of copper at 40–50° C. and, subsequently, another copper plate was deposited by 55-min electroless plating in a chemical bath consisting of 1.7–2.0 g/L of Cu, 15–30 g/L of EDTA, 5.0–9.0 g/L of NaOH, 2.0–4.0 g/L of HCHO and 5–10 mg/L each of 2,2-dipyridyl and KCN at 40–50° C. Following two washings with water, neutralization was performed using an acidic aqueous solution containing 80–100 mL/L of HCl at 20–30° C. for 4 min. The purpose of this neutralization treatment was two-fold: reverting the swollen acrylic emulsion in the undercoat to the initial state, and removing the residual NaOH from the surface of the undercoat and from the interior of the copper deposit formed by electroless plating. The removal of NaOH contributed to an improvement in the adhesion between the undercoat and the copper plate. The neutralized copper plate was subjected to 8-min electroless plating of nickel in a chemical bath consisting of 2.5–7.5 g/L of nickel and 10–40 g/L of sodium hypophosphite at 35–45° C. Following two washings with water, the nickel plate was washed with warm water (45–55° C.) at a pH of 8.7–9.0 for 2 min, then washed with pure water twice. Upon drying in the last step, the Cu and Ni layers formed by electroless plating gave respective thicknesses of 1.5 μm and 0.5 μm. Hence, the metal layers formed by electroless plating had a total thickness of 2 μm.

EXAMPLE 7

Formation of Metal Layer (2)

The undercoat formed in Example 5 was overlaid with metal layers by electroless plating which was conducted in the same manner as in Example 6. Again, Cu and Ni layers were formed in respective thicknesses of 1.5 μm and 0.5 μm; hence, the metal layers formed by electroless plating had a total thickness of 2 μm.

EXAMPLE 8

Measuring the Performance of EMI Shields (1)

The samples of EMI shield produced in Examples 6 and 7 were measured for their performance in the shielding of electromagnetic interference by the method specified in ASTM ES.7.83 (also known as a "transmission line method"). For details of this method, see EMC TECHNOLOGY, Vol. 1, No. 5, 1985. The results of the measurement are briefly shown below.

| Frequency, MHz | 30 | 100 | 300 | 1,000 |
|---|---|---|---|---|
| Shield effect, dB | 62 | 61 | 58 | 62 |

EXAMPLE 9

Measuring the Performance of EMI Shields (2)

The undercoat formed in Example 4 was overlaid with metal layers by electroless plating in the same manner as in Example 6, except that the thickness of the Ni film deposited by electroless plating was fixed at 0.25 μm whereas the thickness of the Cu film deposited by electroless plating was varied at 1 μm, 2 μm and 4 μm. Each of the samples was measured for its shield effect in both an electric and a magnetic field by an ADVANTEST method which was performed with square specimens (150 mm or 200 mm on one side) in thicknesses of no greater than 5 mm being set on a dedicated apparatus (TR17301A) at frequencies of 10–1,000 MHz (1–1,000 MHz for the measurement in an electric field) over a dynamic range of 40 dB or more. The results are briefly shown in Table 1 below.

TABLE 1

| Film thickness, μm | | Shield Effect, dB | | | | | | |
|---|---|---|---|---|---|---|---|---|
| | | In electric field (MHz) | | | | In magnetic field (MHz) | | |
| Cu | Ni | 30 | 100 | 200 | 300 | 30 | 100 | 200 | 300 |
| 1 | 0.25 | 56 | 66 | 72 | 73 | 22 | 34 | 41 | 46 |
| 2 | 0.25 | 56 | 66 | 72 | 74 | 34 | 45 | 52 | 57 |
| 4 | 0.25 | 56 | 66 | 73 | 74 | 41 | 52 | 59 | 65 |

As one can see from Table 1, the shield effect of the test samples in an electric field was substantially constant irrespective of the thickness of the Cu film; on the other hand, the shield effect in a magnetic field increased with the increasing thickness of the Cu film.

EXAMPLE 10

A composite metal oxide hydrate having the formula $Ag_2TiO_3 \cdot n(H_2O)$ was prepared as in Example 1, except that the palladium chloride ($PdCl_2$) was replaced by silver chloride (AgCl). The thus prepared composite metal oxide hydrate had an average particle size of 1–100 μm.

EXAMPLE 11

A composite metal oxide hydrate having the formula $PdSiO_3 \cdot n(H_2O)$ was prepared as in Example 1, except that the titanium oxide ($TiO_2$) was replaced by silicon dioxide ($SiO_2$). The thus prepared composite metal oxide hydrate had an average particle size of 1–100 μm.

EXAMPLE 12

A composite metal oxide hydrate having the formula $PdZrO_3 \cdot n(H_2O)$ was prepared as in Example 1, except that the titanium oxide ($TiO_2$) was replaced by zirconium dioxide ($ZrO_2$). The thus prepared composite metal oxide hydrate had an average particle size of 1–100 μm.

EXAMPLE 13

Three parts of the composite metal oxide hydrate [$Ag_2TiO_3 \cdot n(H_2O)$] which was prepared in Example 10 were added to 7 parts of the binder prepared in Example 2 and the two ingredients were mixed at room temperature until the composite metal oxide hydrate was dispersed uniformly. Thus, paint composition A was prepared. Subsequently, a substrate ABS resin having a thickness of 3 mm was coated on one side with paint composition A by means of a spray gun to give a coating thickness of 20 μm. The applied coating was dried at 70° C. for 30 min to form an undercoat in a thickness of 10 μm. Thereafter, metal layers were formed on the undercoat in accordance with the method described in Example 6. In Example 13, the thickness of the Ni film was fixed at 0.25 μm whereas the thickness of the Cu film was varied at 1 μm, 1.5 μm and 2.0 μm. Each of the samples was measured for its shield effect in both an electric and a magnetic field. The results of the measurement are shown in Table 2 below.

TABLE 2

| Film thickness, μ | | Shield effect, dB | | | | | | |
|---|---|---|---|---|---|---|---|---|
| | | In electric field | | | | In magnetic field | | |
| Cu | Ni | 30 | 100 | 200 | (MHz) 300 | 30 | 100 | 200 | (MHz) 300 |
| 1.0 | 0.25 | 56 | 70 | 70 | 65 | 22 | 32 | 39 | 45 |
| 1.5 | 0.25 | 56 | 70 | 73 | 71 | 25 | 36 | 43 | 49 |
| 2.0 | 0.25 | 56 | 70 | 73 | 71 | 33 | 43 | 49 | 53 |

As one can see from Table 2, the shield effect of the test samples in an electric field was substantially constant irrespective of the thickness of the Cu film; on the other hand, the shield effect in a magnetic field increased with the increasing thickness of the Cu film.

EXAMPLE 14

Three parts of the composite metal oxide hydrate [$PdSiO_3 \cdot n(H_2O)$] which was prepared in Example 11 were added to 7 parts of the binder prepared in Example 3 and the two ingredients were mixed at room temperature until the composite metal oxide hydrate was dispersed uniformly. Thus, paint composition B was prepared. Subsequently, a substrate ABS resin having a thickness of 3 mm was coated on one side with paint composition B by means of a spray gun to give a coating thickness of 20 μm. The applied coating was dried at 70° C. for 30 min to form an undercoat in a thickness of 10 μm. Thereafter, metal layers were formed on the undercoat in accordance with the method described in Example 6. In Example 14, the thickness of the Ni film was fixed at 0.25 μm whereas the thickness of the Cu film was varied at 1 μm, 1.5 μm and 2.0 μm. Each of the samples was measured for its shield effect in both an electric and a magnetic field. The results of the measurement are shown in Table 3 below.

TABLE 3

| Film thickness, μm | | Shield Effect, dB | | | | | | | |
|---|---|---|---|---|---|---|---|---|---|
| | | In electric field (MHz) | | | | In magnetic field (MHz) | | | |
| Cu | Ni | 30 | 100 | 200 | 300 | 30 | 100 | 200 | 300 |
| 1.0 | 0.25 | 55 | 70 | 70 | 69 | 21 | 30 | 38 | 45 |
| 1.5 | 0.25 | 56 | 71 | 72 | 70 | 25 | 36 | 41 | 47 |
| 2.0 | 0.25 | 56 | 70 | 72 | 70 | 32 | 42 | 46 | 50 |

As one can see from Table 3, the shield effect of the test samples in an electric field was substantially constant irrespective of the thickness of the Cu film; on the other hand, the shield effect in a magnetic field increased with the increasing thickness of the Cu film.

EXAMPLE 15

Three parts of the composite metal oxide hydrate [$PdZrO_3 \cdot n(H_2O)$] which was prepared in Example 12 were added to 7 parts of the binder prepared in Example 2 and the two ingredients were mixed at room temperature until the composite metal oxide hydrate was dispersed uniformly. Thus, paint composition A was prepared. Subsequently, a substrate ABS resin having a thickness of 3 mm was coated on one side with paint composition A by means of a spray gun to give a coating thickness of 20 μm. The applied coating was dried at 70° C. for 30 min to form an undercoat in a thickness of 10 μm. Thereafter, metal layers were formed on the undercoat in accordance with the method described in Example 6. In Example 15, the thickness of the Ni film was fixed at 0.25 μm whereas the thickness of the Cu film was varied at 1 μm, 1.5 μm and 2.0 μm. Each of the samples was measured for its shield effect in both an electric and a magnetic field. The results of the measurement are shown in Table 4 below.

TABLE 4

| Film thickness, μm | | Shield Effect, dB | | | | | | | |
|---|---|---|---|---|---|---|---|---|---|
| | | In electric field (MHz) | | | | In magnetic field (MHz) | | | |
| Cu | Ni | 30 | 100 | 200 | 300 | 30 | 100 | 200 | 300 |
| 1.0 | 0.25 | 56 | 71 | 72 | 69 | 20 | 31 | 35 | 46 |
| 1.5 | 0.25 | 56 | 71 | 72 | 70 | 24 | 33 | 40 | 49 |
| 2.0 | 0.25 | 56 | 71 | 72 | 71 | 31 | 40 | 46 | 55 |

As one can see from Table 4, the shield effect of the test samples in an electric field was substantially constant irrespective of the thickness of the Cu film; on the other hand, the shield effect in a magnetic field increased with the increasing thickness of the Cu film.

The shield effect of a test specimen is measured in both a near field and a far field. The near field may be electric or magnetic, and the far field produces horizontal waves. The shield effect in the near field is measured by the ADVANTEST method whereas the shield effect in the far field is measured by the transmission live method. An electric wave (f=30–1,000 MHz) incident on a shield film is partly reflected and partly absorbed such that it is converted to either thermal energy or electric energy in the form of a current, whereby it is attenuated in power. The shield effect involves three elements and may be expressed by the following equation:

$$S \text{ (total shield effect)} = R \text{ (reflection)} + A \text{ (absorption)} + B \text{ (internal effect)}$$

Since B is negligibly small, the shield effect is substantially determined by R and A. Factor R is calculated by:

$$R \text{ }(dB) = 168 + 10 \text{ } \log(\beta/f)$$

Factor A is calculated by:

$$A \text{ }(dB) = 3.34 t \sqrt{f \beta \mu}$$

where β is dielectric constant (per meter), f is frequency (MHz), μ is permeability (henry per meter) and t is film thickness (mil), with one mil being equal to 25.4 μm. Hence, the higher the frequency of the incident electric wave, the less it is reflected and the greater the effect of absorption.

When the dielectric constant increases, both effects of reflection and absorption will increase. The effect of reflection is independent of the thickness of the metal layer; on the other hand, the effect of absorption increases with the thickness of the plated film of the shield. The shield effect is calculated on the basis of the ratio of the energy (power in magnetic field) of the outgoing electric wave to the energy of the incoming electric wave and it is commonly expressed in decibels (dB). The greatest possible shield effect of metal layers formed by electroless plating is comparable to that of a 3-mm thick aluminum plate.

EXAMPLE 16

Peel Test

The metal layers prepared in Examples 6, 7 and 13–15 were tested for their adhesion to the undercoat by the cross cut tape test method specified in ASTM D-3359. Three specimens were provided for each metal layer and translucent pressure-sensitive tapes 25 mm wide (SCOTCH™ acetate fiber tape No. 710 of 3M, USA) were used as adhesive tapes which had an adhesive strength of 40±2.8 g/mm. To a cleaned surface of each specimen, SCOTCH™ tape was attached and within the subsequent 90±30 seconds, the tape was quickly pulled off at an angle that was the nearest possible to 180 degrees. The peeling of the metal layer was visually examined. SCOTCH™ tape was also applied to another area of the same specimen and the same procedure as described above was repeated. According to the criteria for the evaluation of adhesion as set forth in ASTM D-3359, the three specimens of each metal layer under test were rated either 4B (less than 5% of the squares in a grid pattern were pulled off) or 5B (none of the squares in the grid were pulled off). A sample passes the cross cut tape test if it is at least rated 4B.

The EMI shield of the present invention offers the following advantages. Unlike the prior art undercoat using organic solvents, the undercoat of the invention EMI shield is formed of non-organic solvents and, hence, is free from the problem of solvent etching which would otherwise occur due to uneven injection molding rates. In addition, the undercoat of the invention will provide a much higher surface hardness than the conventional organic solvent based undercoat after deposition of a metal plate. A further advantage of the undercoat of the invention is that it has higher chemical resistance than the conventional undercoat. Because of these advantages, the undercoat of the invention will not easily separate from the non-conductive substrate forming the jacket of electronic equipment and, hence, the metal layer formed over this undercoat proves very effective in the shielding of electromagnetic interference over an extended period of time.

What is claimed is:

1. A shield against electromagnetic interference which comprises an undercoat formed on at least one surface of a nonconductive substrate comprising a jacket or case of electronic equipment or part thereof that is vulnerable to electromagnetic interference and a metal layer formed over said undercoat, wherein said undercoat is composed of 10–60 wt % of a composite metal oxide hydrate and 40–90 wt % of a binder and wherein said metal layer is formed by electroless plating of copper and/or nickel; and wherein said composite metal oxide hydrate is represented by the general formula $M_{1x}.M_2O_3.n(H_2O)$ where $M_1$ is Pd or Ag, $M_2$ is Si, Ti or Zr; if $M_1$ is Pd, x is 1 and if $M_1$ is Ag, x is 2, n is an integer.

2. A shield according to claim 1, wherein $M_1$ is Pd and $M_2$ is Si, Ti or Zr.

3. A shield according to claim 1, wherein said binder comprises (1) an acrylic resin paint and/or a urethane resin paint and resin beads or (2) a polyol paint and a curing agent.

4. A shield according to claim 3, wherein said binder is formed of a composition comprising 25–89 wt % of the acrylic resin paint and/or urethane resin paint and 1–15 wt % of the resin beads.

5. A shield according to claim 3, wherein said binder is formed of a composition comprising a mixture of the polyol paint and a polyisocyanate curing agent, the weight ratio of the polyol paint to the polyisocyanate curing agent ranging from 10:1 to 10:10.

6. A shield according to claim 1, wherein the undercoat has a thickness in the range from 3 to 25 μm.

7. A shield according to claim 1, wherein the metal layer has a thickness in the range from 0.5 to 4 μm.

8. A shield according to claim 1, wherein the nonconductive substrate is made of a material selected from the group consisting of: a general-purpose plastic material selected from among PE (polyethylene), PVC (polyvinyl chloride), PS (polystyrene), PP (polypropylene), ABS (acrylonitrile-butadiene-styrene), AS (acrylonitrile-styrene), PMMA (polymethyl methacrylate), PVA (polyvinyl acetate), PVDC (polyvinylidene chloride), PPO (polyphenylene oxide), and PET (polyethylene terephthalate); a general-purpose engineering plastic material selected from among PA (polyamide), POM (polyacetal), PC (polycarbonate); PPE (modified polyphenylene ether), PBT (polybutylene terephthalate), GF-PET (glass fiber reinforced polyethylene terephthalate) and UHPE (ultrahigh-molecular weight polyethylene); a super-engineering plastic material selected from among PSF (polysulfone), PES (polyethersulfone), PPS (polyphenylene sulfide), PAR (polyarylate), PAI (polyamideimide), PEI (polyetherimide), PEEK (polyetheretherketone), PI (polyimide) and fluorocarbon resins; a thermosetting resin selected from among phenolic resins, urea resins, melamine resins, alkyd resins, unsaturated polyesters, epoxy resins, diallyl phthalate polymers, polyurethanes and silicone resins; and a material selected from among rubbers, ceramics, glass, glass fibers, wood, fiber reinforced plastics, porcelain, fibers and paper.

* * * * *